United States Patent [19]

Seki

[11] Patent Number: 4,983,248

[45] Date of Patent: Jan. 8, 1991

[54] THIN-FILM COATING METHOD AND APPARATUS THEREFOR

[75] Inventor: Mitsuhiro Seki, Tokyo, Japan

[73] Assignee: Somar Corporation, Tokyo, Japan

[21] Appl. No.: 285,553

[22] Filed: Dec. 16, 1988

[30] Foreign Application Priority Data

Dec. 16, 1987 [JP] Japan .................................. 62-319879

[51] Int. Cl.$^5$ ............................................. B32B 31/12
[52] U.S. Cl. ..................................... 156/497; 156/289; 156/295; 156/324; 156/555
[58] Field of Search ................. 156/295, 324, 497, 555, 156/289

[56] References Cited

U.S. PATENT DOCUMENTS

| | | |
|---|---|---|
| 3,991,708 | 11/1976 | Huebschmann et al. |
| 4,079,694 | 3/1978 | Galinou |
| 4,338,152 | 7/1982 | Del Bianco et al. |
| 4,378,264 | 3/1983 | Pilette et al. ........................ 156/238 |
| 4,605,454 | 8/1986 | Sayovitz et al. ................ 156/324 X |
| 4,653,303 | 3/1987 | Richard |
| 4,844,772 | 7/1989 | Sumi et al. .......................... 156/497 |

*Primary Examiner*—Robert A. Dawson
*Attorney, Agent, or Firm*—Sughrue, Mion, Zinn, Macpeak & Seas

[57] ABSTRACT

A thin-film coating method for laminating thin-films to opposing surfaces of a substrate and an apparatus for accomplishing the same. A pair of tack members 10E are respectively disposed on opposite sides of the substrate and are moveable in a direction perpendicular to the direction of conveyance of the substrate so as to temporarily tack forward and portions of the thin-films to the substrate. Compression rollers 16 are movably disposed with respect to the substrate such that the compression rollers can respectively contact forward end portions of the thin-films after the tack members have been removed from the substrate. The compression rollers are rotatable to thereby convey the substrate and to cause the thin films to adhere to the opposing surfaces of the substrate. A void-space preventing agent device 30 is provided in a position upstream to the tacking position. The device 30 deposits a void-space preventing agent in the form of mist on the substrate so as to prevent void spaces from developing on the contacting surfaces between the substrate and each of the films.

1 Claim, 3 Drawing Sheets

THIN-FILM COATING METHOD AND APPARATUS THEREFOR

BACKGROUND OF THE INVENTION

The present invention relates to a thin-film coating technique and, more particularly, relates to a technique which effectively serves as a thin-film coating technique for coating a surface of a substrate with a thin film.

Prior Art

Generally, printed circuit boards used in electronic appliances, such as computers or the like, are provided by forming a patterned working of copper or the like on one side or opposite sides of an insulating substrate.

Printed circuit boards of this type can be produced by the following manufacturing process:

First, a lamination composed of a light-sensitive resin (photoresist) layer and a light-transmissive resin film (protective layer) for protecting the light-sensitive resin layer are laminated by thermocompression-bonding onto an electrically conductive layer (copper thin film) provided on an insulating substrate. The thermocompression-bonding lamination is mass-produced by a thin-film coating apparatus called a "laminator". After thermocompression-bonding lamination, a wiring pattern film is overlapped on the lamination and the light-sensitive resin layer is exposed to light for a predetermined period of time through the wiring pattern film and the transmissive resin film. After the transmissive resin film is parted from the substrate by film removing apparatus, the exposed light-sensitive resin layer is developed to form an etching mask pattern. After development, the unnecessary portion of the electrically conductive layer is removed by etching and then the residual part of the light-sensitive resin layer is removed, so that a printed circuit board having a predetermined wiring pattern is prepared.

As described above, according to the conventional thin-film coating method, a lamination composed of a light-sensitive resin (photoresist) layer and a light-transmissive resin film (protective layer) is thermocompression-bonded onto an electrically conductive layer (copper thin film) provided on an insulating substrate. However, the surface of the electrically conductive layer has a slight surface roughness, such that air pockets are formed on the slightly uneven surface of the electrically conductive layer when laminated with the laminated film. Thus, void spaces occur at the contacting surface between the electrically conductive layer and the lamination. Accordingly, the conventional thin-film coating method has a problem in that the adhesion between the electrically conductive layer and the lamination deteriorates, causing a further problem in that the reliability on the wiring of the printed circuit board is lowered.

SUMMARY OF THE INVENTION

The present invention is provided to solve the aforementioned problem.

It is therefore an object of the present invention to provide a thin-film coating technique by which the reliability of a substrate coated with a thin film can be improved.

It is another object of the invention to provide a technique by which the reliability of a printed circuit board can be improved.

It is also an object of the invention to provide a technique by which the creation of voids can be prevented from occurring on a contacting surface between a laminated film and an electrically conductive layer (copper layer) formed on a substrate.

The foregoing and other objects and features of the present invention will be apparent from the following specification and accompanying drawings.

Briefly, the fundamental aspects of the invention disclosed in this specification are as follows:

The present invention provides a thin-film coating method in which tack members are moved respectively near opposite surfaces of a conveyance-direction forward end portion of an insulating substrate to temporarily tack feeding-direction forward end portions of thin films thereto. Compression roller are placed against the forward end portions of the tacked thin films after the tack members have been respectively removed from the surfaces of the substrate, and the compression rollers are rotated to convey the substrate and adhere the thin films to the surfaces of the substrate, characterized in that a void space preventing agent in the form of a mist (i.e., fine particles) is deposited on the substrate and/or the film films before the substrate and the thin films are conveyed to the tacking position, to thereby prevent void spaces from occurring at the contacting surface between the substrate and each thin film.

Further, the invention provides a thin-film coating apparatus in which tack members are moved respectively near opposite surfaces of a conveyance-direction forward end portion of an insulating substrate to temporarily tack feeding-direction forward end portions of thin films thereto, compression rollers are placed against the forward end portions of the tacked thin films after the tack members have been respectively removed from the surface of the substrate, and the compression rollers are rotated to convey the substrate and adhere the thin films to the surfaces of the substrate, characterized in that a device for depositing a void space preventing agent in the form of a mist (i.e., fine particles) onto the substrate and/or thin films is provided prior to the tacking position to which the substrate and thin films are conveyed to thereby prevent void spaces from occurring on the contact surfaces between the substrate and each thin film.

According to the aforementioned construction of the invention, the tack members are moved respectively near the surfaces of the conveyance-direction forward end portion of the substrate to temporarily tack the feeding-direction forward end portions of the thin films thereto after the void preventing agent in the form of mist has been deposited on the substrate and/or the thin films. Thereafter, compression rollers are placed against the forward end portions of the tacked thin films at the tacking position after the tack members are respectively removed from the surfaces of the substrate. The compression rollers are then rotated to convey the substrate and adhere the thin films to the surfaces of the substrate. Because the void preventing agent (which may be water) remaining on the slightly uneven surfaces of the electrically conductive layers laminated with the thin films serves as an adhesive agent by which the resist layer of the thin films is dissolved, the thin films adhere to the surface of the electrically conductive layer so that void spaces can be prevented from occurring at the contacting surface between the electrically conductive layer and the thin film.

Accordingly, the adhesion between the electrically conductive layer and the laminated film can be improved and, at the same time, reliability of the wiring of the printed circuit board can be improved.

DETAILED DESCRIPTION OF THE PREFERRED EMBODIMENT

An embodiment of the present invention, which is applied to a thin-film coating apparatus for coating a printed circuit board with a lamination composed of a light-sensitive resin layer and a light-transmissive resin film by thermocompression-bonding, will be described in detail with reference to the drawings. Items having the same functions are correspondingly referenced throughout the drawings and repeated description of those items is omitted.

Figure 1:
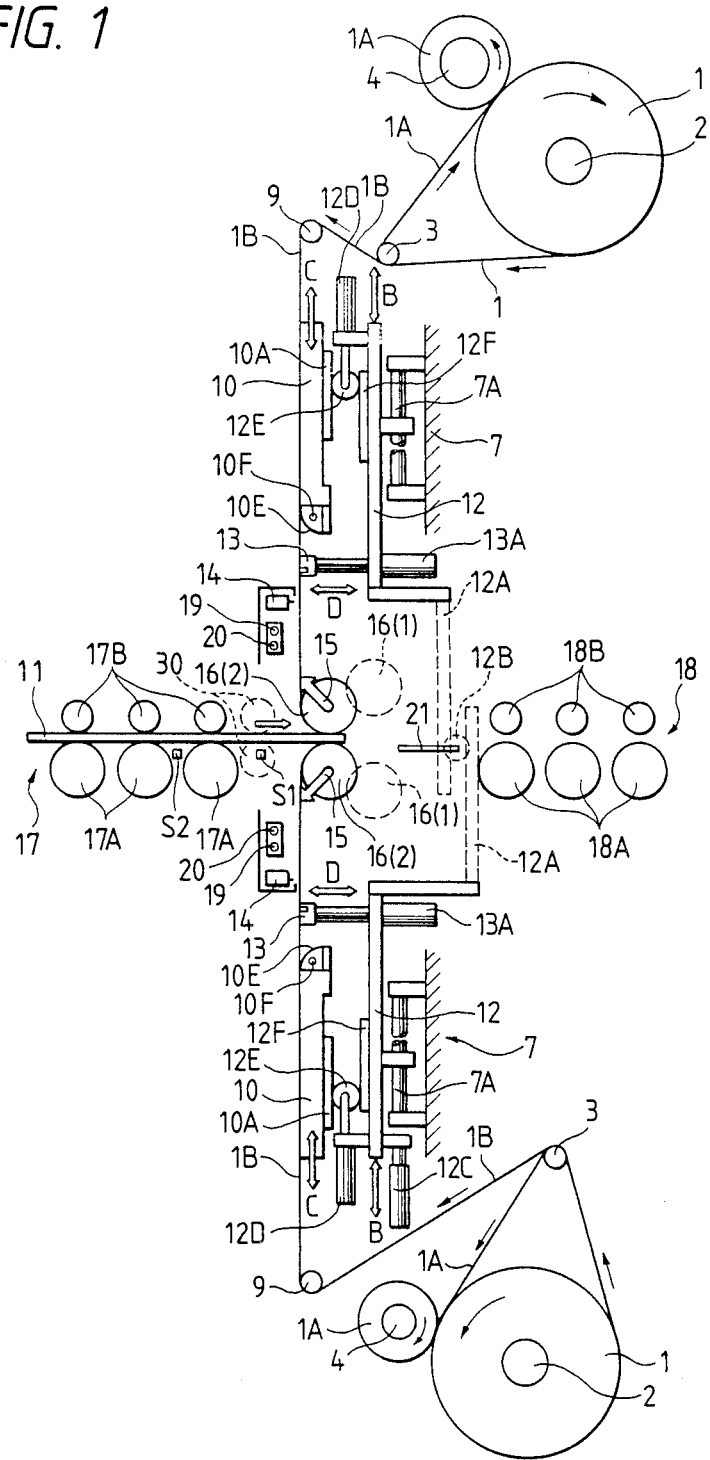
FIG. 1 is a schematic diagram of a thin-film coating apparatus according to one embodiment of the present invention.

The thin-film coating apparatus of the invention is shown in FIG. 1. As shown in FIG. 1, laminations 1 respectively having a three-layer structure constituted by a light-transmissive resin film, a light-sensitive resin layer and a light-transmissive resin layer are continuously wound on feed rollers 2. By means of thin-film separating rollers 3, each of the laminated films 1 on the feed rollers 2 is separated into two parts; that is, a light-transmissive resin film (protective film) 1A and a lamination 1B composed of a light-transmissive resin film and a light-sensitive resin layer having one side (the adhesive surface) exposed. The separated light-transmissive resin films 1A are wound on take up rollers 4.

Figure 2:
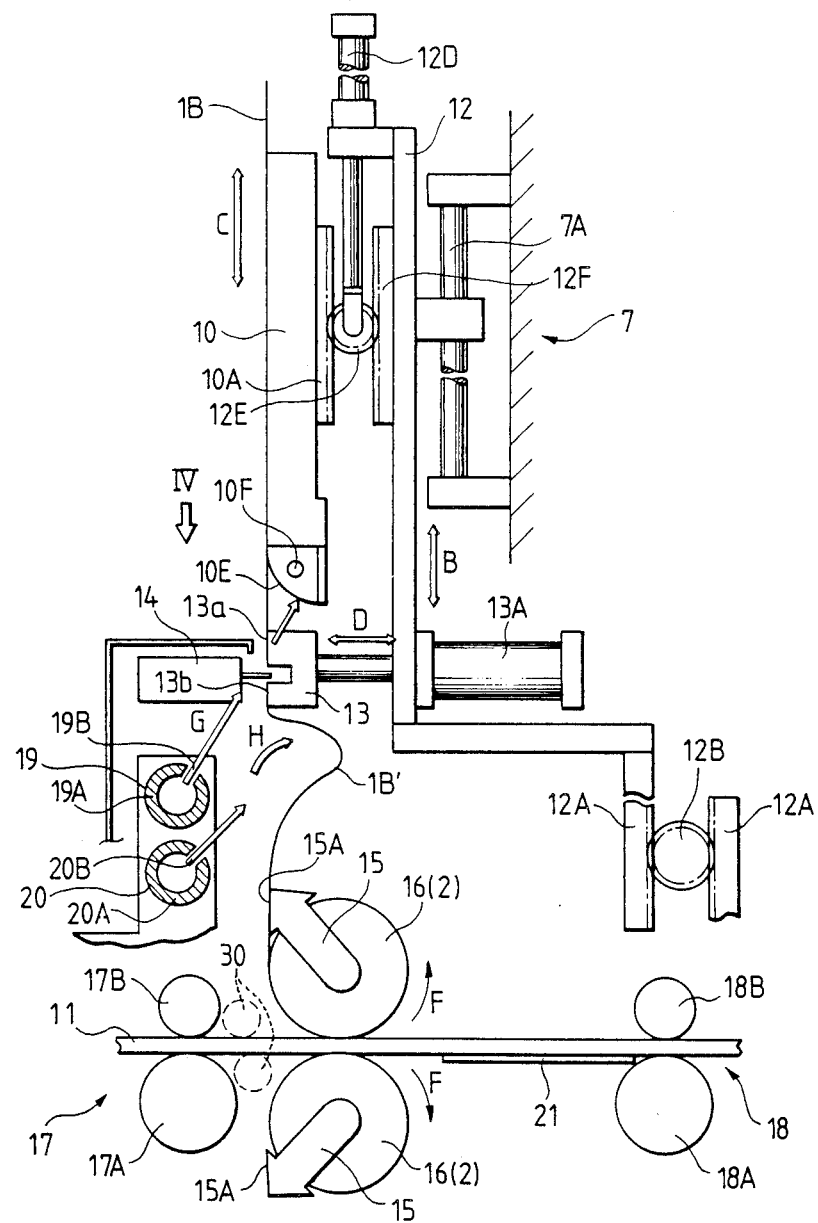
FIG. 2 is a partly enlarged diagram of FIG. 1.

The feeding-direction forward ends of the films 1B separated by the thin-film separating rollers 3 are arranged to be vacuum-secured to main vacuum plates 10 through tension rollers 9 as shown in FIGS. 1 and 2.

Each of the tension rollers 9 is arranged to impart moderate tension to the lamination 1B between the feed roller 2 and the main vacuum plate 10. In other words, each of the tension rollers 9 is arranged to prevent the lamination 1B from creasing.

The main vacuum plates (thin-film feed members) 10 are arranged to feed the laminations 1B from the feed rollers 2 onto the electrically conductive layers (for example, copper film layers) of an insulating substrate 11. The main vacuum plates 10 are provided on supporting members 12 which move close to and far from the insulating substrate 11 in the directions of arrows B as shown in FIGS. 1 and 2. The supporting members 12 are provided on an apparatus body (the box-like body of the thin-film coating apparatus) 7 via guide members 7A which allow for sliding in the direction of the arrows B. The supporting members 12 are arranged in two (upper and lower) positions which are opposite to each other with respect to the conveyance path of the insulating substrate 11. The upper-side supporting member 12 and the lower-side supporting member 12 are linked by a rack-and-pinion mechanism so that the two supporting members 12 are linked to each other by respective racks 12A and a pinion 12b engaged with the racks 12A. The operation of the supporting members 12 is carried out via a driving source 12C provided at the lower-side supporting member 12. For example, the driving source 12C may be formed of an air cylinder. The driving source 12C can also be an oil cylinder, an electromagnetic cylinder, a stepping motor or other transmission mechanism for transmitting a displacement to the supporting members 12.

The main vacuum plates 10 are provided on the supporting members 12 so that the plates 10 can be moved near to and far from the insulating substrate 11 (in the direction of the arrows C) independent of the movement of the supporting members 12. The main vacuum plates 10 are operated by rack-and-pinion mechanisms and driving sources 12D provided on each of the supporting members 12. Each of the rack-and-pinion mechanisms is composed of a pinion 12E provided on the driving source 12D, a rack 12F provided on the supporting member 12, and a rack 10a provided on the main vacuum plate 10. Each of the driving sources 12D may be formed of the same components as the driving source 12C. For example, each of the driving sources 12C and 12D may be formed of an air cylinder and controlled by an electromagnetic valve.

Each of the main vacuum plates is provided with a plurality of suction holes (not shown), by which the lamination 1B can be attracted and held. The holes are connected to a vacuum source such as a vacuum pump through an exhaust pipe. The operation of the main vacuum plates is controlled independently of the suction operation of tack portions 10E.

The tack portions 10E respectively have a side formed as an arc at which the lamination 1B is held. The tack portions are located at the forward ends of the main vacuum plates 10 in the direction of feeding the lamination 1B. The tack portions 10E are united to the main vacuum plates 10, respectively. As shown in FIGS. 1 and 2, heaters 10F for heating the arc-like sides of the tack portions are installed on the tack portions 10E, respectively. The tack portions 10E are constructed so that the forward ends of the laminations 1B fed by the main vacuum plates 10 can be temporarily tacked onto the electrically conductive layers of the insulating substrate 11 as temporary thermocompression-bonding.

Although this embodiment discloses the tack portions 10E united to the main vacuum plates 10, it is a matter of course that the invention is not limited thereto and that the main vacuum plates 10 and the tack portions 10E, independent of the main vacuum plates 10, may be united to the supporting members.

Sub-vacuum plates (thin-film preserving members 13) are provided near the tack portions 10E, that is, near the feeding path of the laminations 1B and between each tack portion 10E and the insulating substrate 11. Each of the sub-vacuum plates 13 is provided with suction holes. As shown in FIG. 2, the sub-vacuum plates 13 have an upper adsorptive portion 13a and a lower adsorptive portion 13b so that the sub-vacuum plate 13 is U-shaped (the U-shaped portion corresponds to a position where the lamination film 1B is cut). The upper adsorptive portion 13a of the sub-vacuum plate 13 is arranged to absorb the feeding-direction forward end of the lamination 1B and secure it to the tack portion 10E. The sub-vacuum plate 13 is mounted on the supporting member 12 through a driving source 13A such as an air cylinder which can move near and far from the feeding path of the lamination film 1B (in the direction of the arrow D) so that the forward end of the lamination 1B can be attracted to the tack portion 10E.

On the other hand, the lower adsorptive portion 13b of the sub-vacuum plate 13 is arranged to attract the backward end of the lamination 1B cut away from the continuous lamination 1B by a cutter 14 and hold it in the feeding path of the lamination 1B. The lower adsorptive portion 13b is arranged to slacken the lamination 1B (that is, the slackened lamination film 1B') as shown in FIG. 2 between it and a rotary vacuum plate 15 after the start of thermocompression-bonding lamination. The slackened lamination 1B' can be formed by controlling the main vacuum plate 10 to increase the feeding speed of the lamination 1B relative to the circumferential speed (thermocompression-bonding lamination speed) of a thermocompression-bonding roller 16. The speed control of the main vacuum plate 10 and the thermocompression-bonding roller 16 is carried out by a sequence control circuit (not shown).

Although the preferred embodiment describes the case where the driving source 13A of the sub-vacuum plate 13 is an air cylinder, it is a matter of course that the driving source may also be an oil cylinder in the same manner as described above for the driving source 12C.

Each of the cutters 14 is fixed to the apparatus body 7 in the vicinity of the feeding path of the lamination 1B which is located between the tack portion 10E and the insulating substrate 11 (more practically, between the tack portion 10E and the rotary vacuum plate 15). In more detail, each of the cutters 14 is arranged opposite to the sub-vacuum plate 13 when the backward end of the lamination 1B is fed to the cutting position and to the side of a front-stage conveyer 17 which is provided to convey the insulating substrate 11 (or the cutter 14 may be arranged directly to the front-stage conveyer 17.) Each of the cutters 14 is arranged so that the lamination 1B continuously fed by the main vacuum plate 10 can be cut a predetermined length corresponding to the size of the insulating substrate 11.

As shown in FIGS. 1 and 2, the laminations 1B in which the forward ends are temporarily tacked on the electrically conductive layers of the insulating substrate 11 in the tacking portions 10E of the main vacuum plates 10 (by temporary thermocompression-bonding), are arranged so that thermocompression-bonding lamination on the whole thereof can be carried out by the thermocompression-bonding rollers 16, respectively. Each of the thermocompression-bonding rollers 16 is placed in a standby position shown by the dotted line in FIG. 1 during the tacking operation in which the forward ends of the lamination films 1B are tacked in the tacking portions 10E. The thermocompression-bonding rollers 16(1) placed in the standby position are arranged so as not to be in contact with the tacking portions 10E moved to the tacking position during the tacking operation. After the tacking operation, the thermocompression-bonding rollers 16 are arranged to be moved from the standby position 16(1), shown by the dotted line, to the tacking position 16(2), shown by the solid line. The thermocompression-bonding rollers 16(2) moved to the tacking position are arranged to nip the insulating substrate 11 through the lamination 1B therebetween.

The backward ends of the lamination films 1B cut by the cutters 14 are arranged to be guided by the triangular rotary vacuum plates 15 so as not to be wrinkled during the thermocompression-bonding lamination by the thermocompression-bonding rollers 16. Each of the rotary vacuum plates 15 is arranged to be coaxially supported on the same shaft as that of the corresponding thermocompression-bonding roller 16 and be rotated around the shaft. A plurality of suction holes 15A (not shown) are provided on the adsorptive surfaces of the rotary vacuum plates 1B opposite to the laminations 1B, respectively. Each of the adsorptive surfaces has the same structure as that of the absorptive surface in each of the main vacuum plates 10. Suction holes (not shown) may be further provided on the upper surfaces of the rotary vacuum plates 15 to make it easier to form the slackened lamination films 1B'.

As shown in FIGS. 1 and 2, the insulating substrate 11 is conveyed to the lamination 1B tacking position of the thin-film coating apparatus by the front-stage conveyer 17 composed of conveyance rollers (lower side) 17A and conveyance rollers (upper side) 17B.

Figure 3:
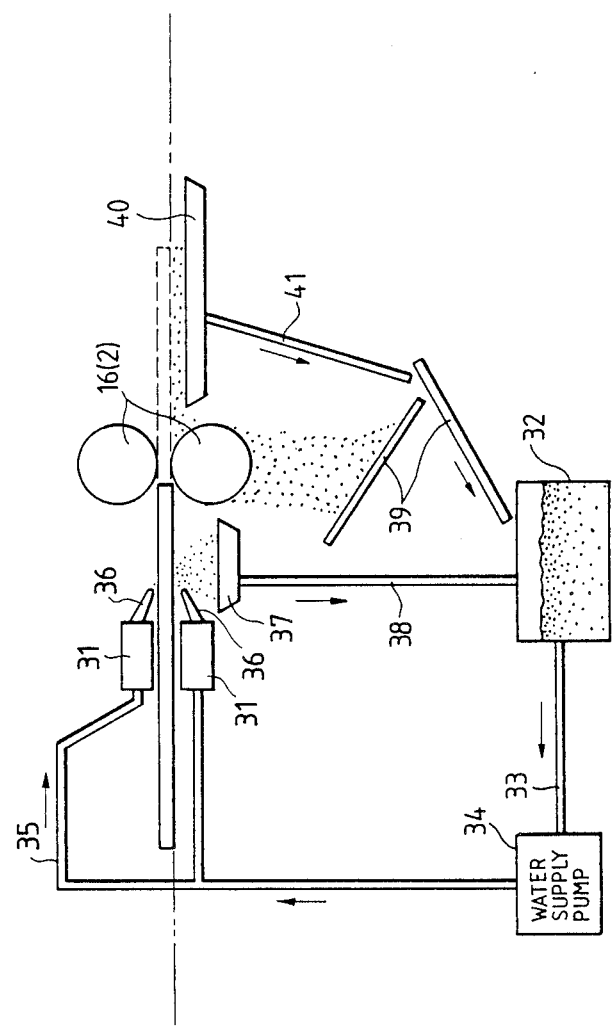
FIG. 3 is a block diagram explaining the schematic arrangement of the void preventing unit depicted in FIG. 1.

A device for depositing a void preventing agent is provided along the front-stage conveyer 17 in order to deposit the void-space preventing agent, such as water, on the substrate 11 before being conveyed to the tacking position. The void-preventing depositing device 30 is provided with an ultrasonic humidifier 31 upstream of the thermocompression-bonding rollers 16(2), as shown in FIG. 3. The humidifier 31 is arranged so that water is continuously supplied by a water tank 32, water supply pipe 33, water supply pump 34 and water supply pipe 35.

The humidifier 31 is arranged so as to apply water to the surface of the substrate 11 from its nozzle 36. At that time, the remainder of water is received by a water saucer 37 and fed to the water tank 32 through an exhaust pipe 38. On the other hand, water removed when the laminations 1B' are adhered to the substrate 11 by the thermocompression-bonding rollers 16(2) is received by a water shoot 39 and fed back to the water tank 32. Further, water deposited on the substrate 11 having the laminations 1B' adhered thereto is received by a water saucer 40 and fed back to the water tank 32 through an exhaust pipe 41.

As described above, the void preventing agent is deposited onto the substrate 11 and/or laminations 1B' by the humidifier 31 of the void-preventing depositing device 30 before the substrate 11 and lamination films 1B' are conveyed to the tacking position. Subsequently, the tacking portions 10E are respectively placed against the opposite surfaces of forward end portion (in the conveyance-direction) of the substrate 11 so that the forward end portions of the lamination films 1B' are tacked thereto. Thereafter, the thermocompression-bonding rollers 16(2) are placed against the forward end portions of the tacked laminations 1B' in the tacking position after the tacking portions 10E are respectively removed from the surfaces of the substrate 11. Then the thermocompression-bonding rollers 16(2) are rotated to convey the substrate 11 and adhere the lamination 1B' to the surfaces of the substrate 11. Because the water remaining on the slightly uneven surface of the electrically conductive layers of the laminated substrate 11 serves as an adhesive agent by which the photoresist (light-sensitive resin) layers of the laminations 1B' are dissolved, the laminations 1b' come in close contact with the surfaces of the electrically conductive layers so that void space can be prevented from occurring on the contacting surface between the electrically conductive layer and the lamination film. Accordingly, the adhesion between the substrate 11 and the lamination 1B' can be improved and, at the same time, reliability on the wiring of the printed circuit board can be improved.

Preferably, water-soluble type material is used as the photoresist (light-sensitive resin) of the lamination 1B. Further, a surface tension adjusting agent, a copper surface adhesive agent and the like may be added to water to be used as a void-preventing depositing agent.

In the front-stage conveyer 17, a sensor S1 for detecting the position of the forward end portion of the insulating substrate 11 is arranged in the vicinity (position for detecting the forward end portion of the substrate) of the substrate-conveyance path prior to the tacking position. The sensor S1 is constructed so that a detection signal for starting the operation of a preset counter of a microcomputer (CPU) is generated when the forward end portion of the insulating substrate 11 is detected. The preset counter is constructed so that a control signal is generated for stopping the forward end portion of the substrate 11 in the tacking position when a predetermined number is counted. For example, the sensor S1 is formed of a photoelectric switch.

Further in the front-stage conveyer 17, a sensor S2 for detecting the position of the rear end portion of the insulating substrate 11 is arranged in the vicinity (position for detecting the backward end portion of the substrate) of the substrate-conveyance path prior to the sensor S1. The sensor S2 is constructed in the same manner as the sensor S1 so that a detection signal for starting the operation of another preset counter of the microcomputer (CPU) is generated when the rear end port ion of the insulating substrate is detected. The preset counter is constructed so that a control signal is generated for forming the slack 1B' of the laminations 1B in the rear end portions, cutting the laminations 1B at the cutting positions by the cutters 14 and sticking the rear end portions of the thus cut lamination 1B to the insulating substrate 11 by thermocompression-bonding lamination when a predetermined time is counted. Further, the preset counter is provided to generate a control signal for moving the thermocompression-bonding rollers 16 from the tacking position to the vicinity of the standby position, as well as for adhering the rear end portions of the lamination films 1B to the insulating substrate 11 by thermocompression-bonding lamination. For example, the sensor S2 is formed of a photoelectric switch in the same manner as the sensor S1.

On the other hand, a rear-stage conveyer 18 composed of conveyance rollers (lower side) 18A and conveyance rollers (upper side) 18B is constructed so that the insulating substrate 11 having the laminations 1B stuck thereto by the thermocompression-bonding rollers 16 of the thin-film coating apparatus can be conveyed to an exposure apparatus in which a wiring pattern is formed.

As shown in FIGS. 1 and 2, thin-film correcting units 19 are provided on the apparatus body 7 (or front-stage conveyer 17, or supporting members 12) in the vicinity of the movement path (thin-film feeding path) of the tacking portions 10E of the main vacuum plates 10. The thin-film correcting units 19 are arranged to correct the forward end portions of the laminations 1B in such directions (of the arrow G) that the forward end portions of the laminations 1B can be brought into close contact with the tacking portions 10E. Each of the thin-film correcting units 19 is composed of a fluid pipe 19A extending along the width of the lamination film 1B, and a plurality of fluid blowing holes 19B provided in the fluid pipe 19A.

The fluid pipe 19A is hollow and is provided to pass fluid having pressure higher than the ordinary pressure. Although this embodiment has shown the case where the fluid pipe 19A is substantially circularly shaped in section, it is a matter of course that the invention is not limited to the specific embodiment and that the fluid pipe 19A may be shaped quadrangularly or elliptically in section.

The fluid blowing hole 19B are arranged to blow fluid in such a direction that the lamination 1B can be corrected. Although air is used as the fluid in the thin-film correcting units 19, air may be replaced by any other gas such as an inert gas, or the like, or may be replaced by a liquid such as water, oil or the like.

As shown in FIGS. 1 and 2, thin-film projecting units 20 are respectively connected to the apparatus body 7 (or front-stage conveyer 17, or supporting members 12) in the vicinity of the corresponding lamination 1B' fed between the lower adsorptive portion 13b of the sub-vacuum plate 13. The thin-film projecting units 20 are arranged to form the laminations 1B' slackened in such directions (of the arrow H) that the laminations 1B can be brought into close contact with the thermocompression bonding rollers 16. Each of the thin-film projecting units 19 is composed of a fluid pipe 20A extending along the feeding direction width of the lamination film 1B, and a plurality of fluid blowing holes 20B provided along the fluid pipe 20A.

The fluid pipe 20A is hollow and is provided to pass fluid having pressure higher than the ordinary pressure. Although this embodiment describes the case where the fluid pipe 20A is substantially circularly shaped in section, it is a matter of course that the invention is not limited to the specific embodiment and that the fluid pipe 20A may be shaped quadrangularly or elliptically in section in the same manner as the fluid pipe 19A.

The fluid blowing holes 20B are arranged to blow fluid in such a direction that the slack of the lamination 1B' can be projected as described above. Although air is used as the fluid in the thin-film projecting units 20 in the same manner as in the thin-film correcting units 19, air may be replaced by any other gas such as an inert gas, or the like, or may be replaced by a liquid such as water, oil or the like.

Further, the invention is applicable to the case where the thin-film correcting units 19 or thin-film projecting units 20 may be composed of a plurality of fluid spraying nozzles arranged in the direction of width of the lamination 1B in order to correct or project the lamination 1B in a suitable direction.

Further, the invention is applicable to the case where the thin-film correcting units 19 or thin-film projecting units 20 are composed of a suction pipe extending along the width of the lamination 1B, and a plurality of suction holes are provided in the suction pipe in order to suck the lamination 1B in such a suitable direction that the lamination 1B can be corrected or projected as described above.

Further, the invention is applicable to the case where the thin-film correcting units 19 or thin-film projecting units 20 are composed of a projecting member to correct or project the lamination 1B in such a suitable direction as described above.

Further, the invention is applicable to the case where the thin-film correcting units 19 serve as thin-film projecting units 20 or to the case where the thin-film projecting units 20 serve as thin-film correcting units 19.

As shown in FIGS. 1 and 2, a substrate guiding member 21 is connected to the apparatus body 7 (or rear-stage conveyer 18) between the thermocompression-bonding roller 16(2) placed in the tacking position and the conveyance roller 18A of the rear-stage conveyer 18. The substrate guiding member 21 is arranged so that the insulating substrate 11 having the laminations 1B adhered thereto by thermocompression-bonding lamination can be guided from the thermocompression-bonding lamination position (tacking position) to the position of the conveyance roller 18A and 18B. For example, the substrate guiding member 21 is composed of a plurality of bar-like portions respectively extending in the direction of conveyance of the insulating substrate 11 and arranged in the direction of conveyance width thereof, in the form of a comb. The substrate guiding member 21 thus shaped like a comb can guide the insulating substrate 11 smoothly, because the contacting area between the insulating substrate 11 and the substrate guiding member 21 during the conveyance of the insulating substrate 11 can be reduced to thereby reduce the frictional resistance thereof.

The invention is applicable to the case where the substrate guiding member 21 may have a net-like structure or a plate-like structure.

The method for thermocompression-bonding lamination of the laminations 1B according to the thin-film coating apparatus of the invention will be described briefly with reference to FIGS. 1 and 2.

First, as shown in FIGS. 1 and 2, the forward ends of the laminations 1B separated by the thin-film separating rollers 3 are respectively arranged between the sub-vacuum plate 13 and the cutter 14 by hand.

Next, the forward ends of the lamination films 1B are attracted by the sub-vacuum plates 13. After the attraction of the lamination 1B, the sub-vacuum plates 13 are moved respectively to a position far from the feeding path of the lamination 1B by the driving sources 13A so that the forward ends of the lamination are attracted to the tacking portions 10E. At the same time the absorbing operation of the tacking portions 10E of the main vacuum plates 10 is carried out, the laminations 1B can be corrected by the thin-film correcting units 19. Accordingly, the forward ends of the laminations 1B can be securely attached to the tacking portions 10E. When, for example, a continuous operation is made, the forward ends of the laminations 1B cut by the cutters 14 are attracted to the tacking portions 10E.

Next, the insulating substrate 11 is conveyed by the conveyance rollers 17A and 17B of the front-stage conveyer 17. Before the substrate 11 reaches the tacking position, water is applied to the surfaces of the substrate 11 by the ultrasonic humidifier 31. Thereafter, when the conveyance-direction forward end portion of the insulating substrate 11 passes through the position prepared for detecting the forward end portion of the substrate, the sensor S1 operates to detect the position. The detection signal from the sensor S1 is fed to the CPU to thereby operate one preset counter. The preset counter counts to a predetermined time for stopping the conveyance-direction forward end portion of the insulating substrate 11 in the tacking position.

Further, the detection signal from the sensor S1 operates another preset counter of the CPU. The other preset counter counts a start time for moving the tacking portions 10E near to the conveyance path while the forward end portion of the insulating substrate 11 is conveyed from the position for detecting the forward end of the substrate to the tacking position.

In this condition, the tacking portions 10E (main vacuum plates 10) are respectively placed in the position for starting the tacking operation, whereas the thermocompression-bonding rollers 16 are arranged in the standby position. The position for starting the tacking operation is a position where the driving source 12D operates to move the main vacuum plates 10 in the condition that the upper-side and lower-side supporting members 12 stop at the closest points to the substrate-conveyance path.

Next, the approaching operation of the tacking portion 10E starts while the forward end portion of the insulating substrate 11 is conveyed from the position for detecting the forward end of the substrate to the tacking position. The approaching operation of the tacking portions 10E can be started by the driving source 12D controlled by the CPU based on the output signal of the other preset counter.

Next, when the forward end of the insulating substrate 11 reaches the tacking position based on the output signal of the aforementioned preset counter, the conveyance of the insulating substrate 11 stops. At substantially the same time as the insulating substrate 11 stops, or slightly thereafter, the tacking portions 10E come in contact with the electrically conductive layers of the conveyance-direction forward end portion of the insulating substrate 11 so that the forward ends of the lamination films 1B attached to the tacking portions 10E are temporarily adhered to the substrate by temporary thermocompression-bonding.

As described above, in the method of adhering the laminations 1B, the forward end portion of the insulating substrate 11 is detected at the position for detecting the forward end of the substrate before being conveyed to the tacking position. The conveyance of the insulating substrate 11 is stopped based on the detection signal after the forward end portion of the insulating substrate 11 is conveyed from the position for detecting the forward end of the substrate to the tacking position. At the same time, the tacking portions 10E are moved near the substrate-conveyance path while the forward end portion of the insulating substrate 11 is conveyed from the position for detecting the forward end of the substrate to the tacking position. After the forward end portion of the insulating substrate 11 is stopped in the tacking position, the forward ends of the lamination films 1B are tacked onto the electrically conductive layers of the insulating substrate 11 by the tacking portions 10E. Accordingly, a portion of the time required for moving the tacking portions 10E close to the conveyance path can be incorporated in the time required for conveying the forward end portion of the insulating substrate 11 from the position for detecting the forward end of the substrate to the tacking position. Because the time substantially required for moving the tacking portions 10E near the conveyance path (that is, the time required for terminating the tacking operation after the forward end portion of the insulating substrate 11 has reached the tacking position) is shortened, the time required for adhering the lamination films 1B can be shortened. Consequently, because the number of times of adhering the laminations 1B per unit time can be increased, the capacity of production as to thin-film coating can be improved.

When the tacking portions 10E come in contact with the electrically conductive layers of the forward end portion of the insulating substrate 11, the driving sources 12D begin operation. The operation of the driving sources 12D are fed to the CPU by which the tacking operation is preserved for a predetermined time. Then the absorbing operation of the main vacuum plates 10 and tacking portions 10E is stopped, so that the main vacuum plates 10 and tacking portions 10E are removed from the conveyance path by the driving sources 12C and 12D. More particularly, the main vacuum plates 10, tacking portions 10E and sub-vacuum plates 13 are moved to the position shown in FIGS. 1 and 2, by the driving sources 12C and 12D. The distance of the movement is proportional to the quantity of the slack of the lamination 1B'.

Next, as shown in FIG. 1, the thermocompression-bonding rollers 16 are moved from the standby position, shown by the dotted line, to the tacking position, shown by the solid line, so that the thermocompression-bonding rollers 16 are brought into contact with the laminations 1B temporarily tacked at the forward ends.

Next, the thermocompression-bonding rollers 16 are rotated while the insulating substrate 11 is nipped therebetween to thereby adhere the laminations 1B to the electrically conductive layers of the insulating substrate 11 by thermocompression-bonding lamination. At this time, the absorbing operation of the main vacuum plates 10, tacking portions 10E and sub-vacuum plates 13 is stopped, so that the laminations 1B can be automatically fed from the feed rollers 2 to the thermocompression-bonding rollers 16 by the rotational force and the nipping force against the insulating substrate 11, of the thermocompression-bonding rollers 16.

Thereafter, the laminations 1B are bonded through thermocompression and laminated by a predetermined quantity, so that the rear end portion of the insulating substrate 11 is detected by the sensor S2 at the position for detecting the rear end of the substrate as shown in FIG. 1. The detection signal from the sensor S2 for detecting the rear end of the substrate is fed to the CPU so that the absorbing operations of the main vacuum plates 10, sub-vacuum plates 13 and rotary vacuum plates 15 are substantially simultaneously started. Then the supporting members 12 are moved from the farthest position from the substrate-conveyance path by the driving sources 12C, so that the laminations 1B are excessively supplied to the side of the insulating substrate 11 by the main vacuum plates 10 and, at the same time, the feeding-direction rear end portions (cutting position) of the laminations 1B are adjusted to coincide with the cutting position of the cutters 14 at the lower adsorptive portions 13b of the sub-vacuum plates 13 as shown in FIG. 2. The supply speed of the laminations 1B (that is, movement speed of the supporting members 12) is established to be more than the thermocompression-bonding lamination speed (that is, circumferential speed of the thermocompression-bonding rollers 16) of the thermocompression-bonding rollers 16(2).

In this condition, each of the laminations 1B is slackened between the sub-vacuum plate 10 and the rotary vacuum plate 15 to thereby prepare the slack of the lamination 1B'. The opposite ends of the slackened lamination 1B' can be corrected by the thin-film correcting unit 20 so as to be securely adsorbed to the lower adsorptive portion 13b of the sub-vacuum plate 13 and the rotary vacuum plate 15.

Next, the rear ends of the laminations 1B adjusted to coincide with the cutting position of the cutters 14 are cut into a predetermined length corresponding to the size of the insulating substrate 11 by the cutters 14, respectively. While the rear ends of the laminations 1B are bonded through thermocompression and are laminated, the thermocompression-bonding rollers 16 are moved in the same direction as the substrate-conveyance directions.

Next, the thermocompression-bonding rollers 16 are moved until the rear ends of the lamination films 1B are perfectly bonded through thermocompression and laminated onto the electrically conductive layers of the insulating substrate 11 by the rotary vacuum plates 15, as well as the rollers 16 conveying the insulating substrate 11. The thermocompression-bonding rollers 16 can be moved near the standby position. The rotary vacuum plates 15 rotate at a relatively slow speed compared with the rotational speed of the thermocompression-bonding rollers 16, so that the rear ends of the laminations 1B are bonded through thermocompression and laminated onto the electrically conductive layers of the insulating substrate 11, respectively. Because a moderate amount of tension can be given to the respective lamination 1B between the rotary vacuum plate 15 and the thermocompression-bonding roller 16 by rotating the rotary vacuum plates 15 slightly slower than the thermocompression-bonding rollers 16, the thermocompression-bonding lamination can be completed without wrinkling the laminations 1B.

After the thermocompression-bonding lamination is finished, the thermocompression-bonding rollers 16 are moved from the vicinity of the standby position to the standby position in such a direction that the rollers 16 are removed from the substrate-conveyance path.

The invention is applicable to a thin-film coating apparatus in which, after the insulating substrate 11 is preheated, as in the aforementioned embodiment, the laminations 1B are bonded through thermocompression and laminated onto the insulating substrate 11 by non-thermocompression-bonding rollers.

Further, the invention is applicable to a thin-film coating apparatus for sticking protective films onto a smoothly planed board as a building material.

As described above, according to the present invention, a void space can be prevented from occurring on the contacting surface between the electrically conductive layer and the thin film. Accordingly, the adhesion between the electrically conductive layer and the lamination can be improved. Consequently, reliability on the wiring of the printed circuit board can be improved.

What is claimed is:

1. A thin coating apparatus for laminating thin films to a substrate, comprising:
   a pair of tack members, respectively disposed on opposite surfaces of said substrate, each tack member being bidirectionally moveable in directions perpendicular to a direction of conveyance of said substrate so as to temporarily tack respective forward end portions of said thin films thereto;
   compression rollers movably disposed with respect to said substrate such that said compression rollers respectively contact said forward end portions of said thin film upon withdrawal of said tack members from said substrate, said compression rollers being rotatable to convey said substrate and cause said respective thin films to adhere to said opposing surfaces of said substrate; and
   means for depositing a void-space preventing agent in the form of mist on one of said substrate and said thin films at a position upstream of said tack members so as to prevent void surfaces from developing on contacting surfaces between said substrate and each of said thin films, said means for depositing a void-space preventing agent comprising an ultrasonic humidifier attached to a frame disposed along said direction of conveyance of said substrate.

* * * * *